United States Patent [19]

Mohsen et al.

[11] 3,918,997

[45] Nov. 11, 1975

[54] METHOD OF FABRICATING UNIPHASE CHARGE COUPLED DEVICES

[75] Inventors: Amr Mohamed Mohsen, North Plainfield; Carlo Heinrich Sequin, New Providence, both of N.J.

[73] Assignee: Bell Telephone Laboratories, Incorporated, Murray Hill, N.J.

[22] Filed: Dec. 6, 1974

[21] Appl. No.: 530,507

[52] U.S. Cl. .................... 148/1.5; 307/304; 357/24; 357/91

[51] Int. Cl.² .......................................... H01L 21/263

[58] Field of Search ................. 148/1.5; 357/24, 91; 307/304

[56] References Cited

UNITED STATES PATENTS

| | | | |
|---|---|---|---|
| 3,792,322 | 2/1974 | Boyle et al. | 357/24 |
| 3,793,088 | 2/1974 | Eckton, Jr. | 148/1.5 |
| 3,796,932 | 3/1974 | Amelio et al. | 357/24 |
| 3,836,409 | 9/1974 | Amelio et al. | 357/24 X |

OTHER PUBLICATIONS

Bower et al. "A High Density Overlapping Gate Charge Coupled Device Array," 1973 International Electron Device Meeting, Tech. Dig. pp. 30–32.

*Primary Examiner*—T. Dewayne Rutledge
*Assistant Examiner*—J. M. Davis
*Attorney, Agent, or Firm*—L. H. Birnbaum

[57] ABSTRACT

A method for making charge coupled devices of the type which are addressable by a single clock phase. Photoresist masks are offset with respect to stepped oxide patterns in order to produce by ion implantation self-aligned surface regions which are needed for potential asymmetry. Such surface regions can thereby be made smaller than the minimum mask feature. The oxide pattern in the final device may be formed by using silicon nitride to mask against oxide growth in selected areas. A single layer of metal may then be formed over the oxide to establish a uniphase charge coupled device with a cell length which is just twice the size of the minimum mask feature.

13 Claims, 20 Drawing Figures

METHOD OF FABRICATING UNIPHASE CHARGE COUPLED DEVICES

BACKGROUND OF THE INVENTION

This invention relates to the fabrication of charge coupled devices, and in particular uniphase charge coupled devices with fine dimensions.

Charge coupled devices (CCDs) are by now a well-established class of information processing semiconductor devices. The devices operate under the principle that discrete packets of charge may be stored and transferred in a semiconductor medium by an appropriate pulsing of electrodes disposed on an insulating layer overlying the semiconductor. The earliest devices usually utilized 2 or 3-phase addressing means for effecting movement of the charge packets. Subsequently, the idea evolved that a single-phase clock could be utilized for addressing if surface regions of impurities were included in the semiconductor to establish an appropriate surface potential asymmetry. (See, for example, U.S. Pat. No. 3,796,932). Such uniphase structures reduced the number of conduction paths required for addressing, and permitted more compact devices by reducing the cell length. Fabrication of such structures, however, remained a problem especially in view of the desire for compactness and the requirement of multiple surface regions of impurities in the semiconductor properly aligned with the electrode pattern to achieve the necessary asymmetry for efficient charge transfer.

It is therefore an object of one aspect of the invention to fabricate uniphase CCDs with minimum cell dimensions consistent with allowable mask tolerances.

SUMMARY OF THE INVENTION

To this end, in accordance with a preferred embodiment of the invention, surface regions are formed in the semiconductor by ion implantation through photoresist masks offset with respect to a stepped oxide pattern so that the surface region can be made smaller than the minimum mask feature and can be accurately aligned with respect to the oxide steps in the final transfer path. In further processing, a silicon nitride mask is utilized to form a thick-thin oxide pattern which contributes to the proper potential asymmetry, and a single metal layer is formed thereon. The final structure has a cell length which is only twice the width of the minimum mask feature.

BRIEF DESCRIPTION OF THE DRAWING

These and other features of the invention will be delineated in detail in the description to follow. In the drawing.

It will be appreciated that for purposes of illustration these figures are not necessarily drawn to scale.

DETAILED DESCRIPTION OF THE INVENTION

The principles of the invention method can best be explained in reference to the sequence of steps illustrated in FIGS. 1A–1G.

Figure 1A:
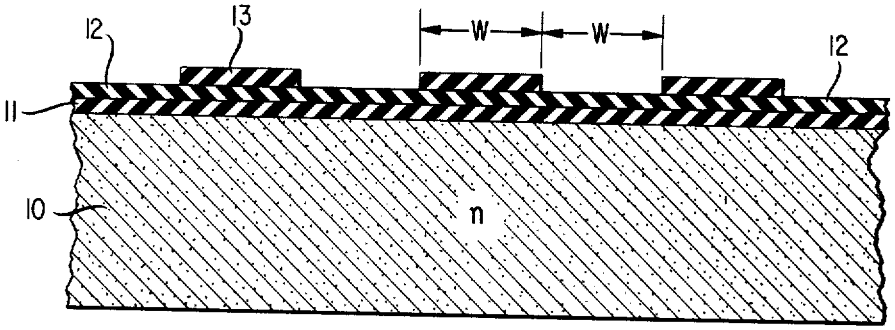
FIGS. 1A–1G are cross-sectional views of a portion of a CCD row in various stages of manufacture in accordance with one embodiment of the invention.
Figure 1B:
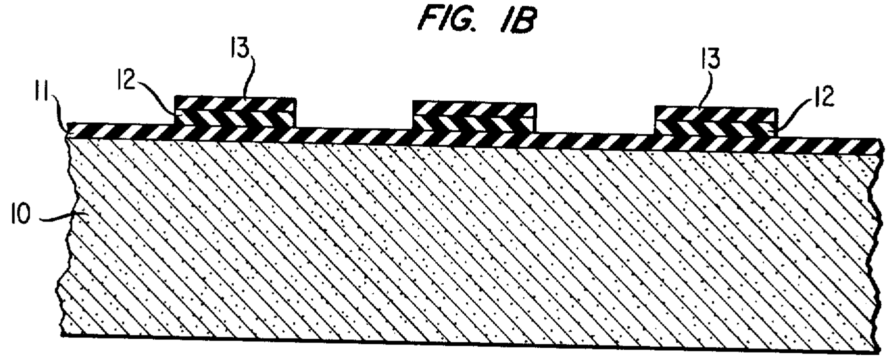

As shown in FIG. 1A, the semiconductor storage medium, 10, is illustratively n-type silicon. Of course, a p-type semiconductor can also be utilized with a reversal of all polarities to be described. In addition, the method could also be used to form uniphase CCDs of the "buried channel" type wherein the semiconductor comprises a semiconductor storage layer of opposite conductivity type formed over a semiconductor substrate and the charge carriers are moved in the bulk of the storage layer rather than at the surface. Such classes of devices are described in detail in U.S. Pat. No. 3,792,322. Application of the inventive method to form buried channel CCDs involves some modification in the polarities to be described which are within the knowledge of the skilled artisan and are therefore not discussed.

Formed on the semiconductor is a first insulating layer, 11, which in this example is $SiO_2$. Formed over the first layer 11 is a second insulating layer 12 advantageously comprising silicon nitride. The insulating layers may be grown or deposited by standard techniques well known in the art. For example, layer 11 may be grown by thermal oxidation and layer 12 may be deposited by vacuum evaporation. Illustratively, layer 11 has a thickness of approximately 1,000 Angstroms, while layer 12 is deposited to a thickness of approximately 2,000 Angstroms. A third insulating layer, 13, which can be $SiO_2$, is then deposited over the silicon nitride layer 12. This layer may have a thickness, for example, of approximately 3,000 Angstroms. The layer 13 may be patterned, as shown, by standard photolithographic techniques. That is, a photoresist layer (not shown) is formed over a uniform unpatterned insulating layer and exposed to light through a mask with apertures of width and distance between the apertures W, followed by developing the photoresist and etching the insulating layer in the areas not protected by photoresist to pattern it. An etchant such as hydrofluoric acid is preferably employed which will etch the exposed silicon dioxide but not the underlying silicon nitride to form the geometry shown. The value W is advantageously the miminum mask feature which is consistent with resolution and tolerance requirements. In the present state of the art, this value is approximately 6–8 microns but may decrease as it improves. Next, the layer 13 acts as a mask for etching the exposed portions of the silicon nitride layer to produce the geometry of FIG. 1B. A suitable etchant for removing silicon nitride without affecting the $SiO_2$ layers is ortho-phosphoric acid. The resulting structure therefore comprises discrete regions of silicon nitride-silicon dioxide multilayers of width and spacing W formed over the initial oxide layer 11.

Figure 1C:
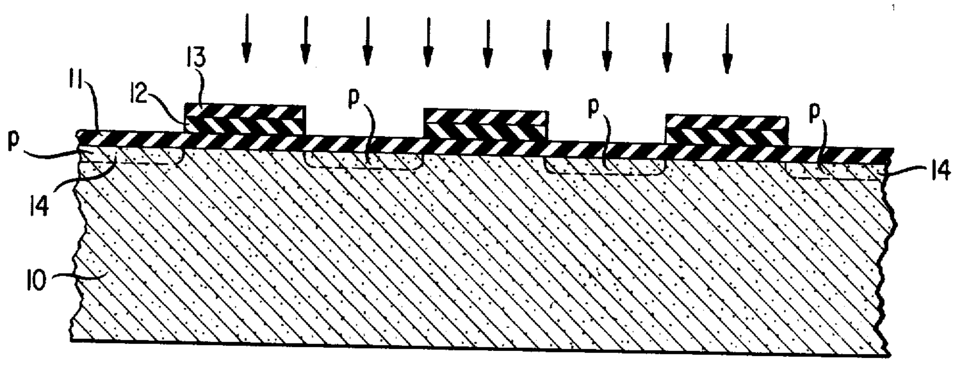
Figure 1D:
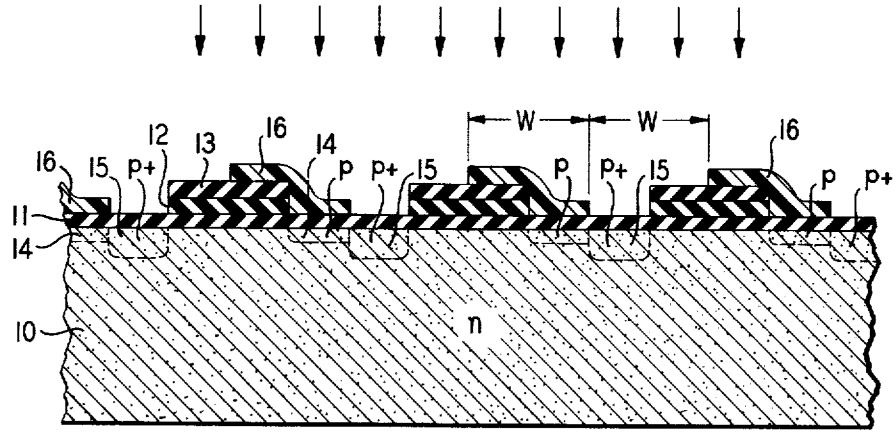

These multilayer regions are formed to a sufficient thickness to act as barriers to the subsequent ion implantation. This step is illustrated in FIG. 1C. The structure is subjected to a beam of approximate ions which are illustrated as arrows, in order to form p-type regions, 14, at the surface of the semiconductor in the areas not covered by the multilayer regions. Typically, these implanted regions have a depth of approximately 500–2,000 Angstroms. Any suitable p-type ion may be employed, for example, boron. The thickness of layer 11 is chosen to permit passage of the beam therethrough. Of course, the thicknesses of the layers required will be dependent upon the type of impurities and the energy of the ion beam. Such parameters can be easily determined by thosed skilled in the art according to particular needs A photoresist mask, 16, is then formed over the oxide pattern as shown in FIG. 1D. Again, the mask may be formed by depositing photoresist uniformly and exposing the photoresist to light through a mask with apertures of width and spacing W, followed by developing the photoresist to form the pattern indicated. In this step, however, the photoresist mask, 16, is offset by approximately w/2 with respect to the stepped oxide regions 12 and 13. The photoresist regions therefore each overlap approximately one-half the stepped oxide 12 and 13 and one-half the original gate oxide 11 between the stepped oxide regions. Of course, the amount of offset can be varied. It appears, however, that an affset of approximately W/4 to W/2 will give optimum results for a cell length of minimum dimensions. The resulting structure can then be subject to a second ion beam again indicated by arrows as shown in FIG. 1D, to produce a second set of p-type surface regions 15 in the semiconductor. These regions will be confined to the areas of semiconductor not covered by either a photoresist or stepped oxide region as shown. As in the first ion implantation, the beam may comprise boron ions with a dose of approximately $5 \times 10^{11}$ $cm^{-2}$. If the ion beam energy of the second implant is the same as the first, the depth of regions 15 will be the same as regions 14. Regions 15 are shown deeper in the figures to indicate that regions 15 have a higher concentration than regions 14, namely, the sum of the doses of the two implants in these areas. It will be realized that utilization of the photoresist mask offset with respect to the stepped oxide results in surface regions 14 and 15 which are narrower than the mimimum mask feature (in this case with a width of W/2).

The photoresist may then be stripped off with a suitable material such as sulphuric acid at a temperature of approximately 110°C, followed by removal of $SiO_2$ layer 13 and portions of $SiO_2$ layer 11 which are not covered by the silicon nitride regions 12. A suitable etchant for removing these layers without affecting the silicon nitride layer is buffered hydrofluoric acid.

Figure 1E:
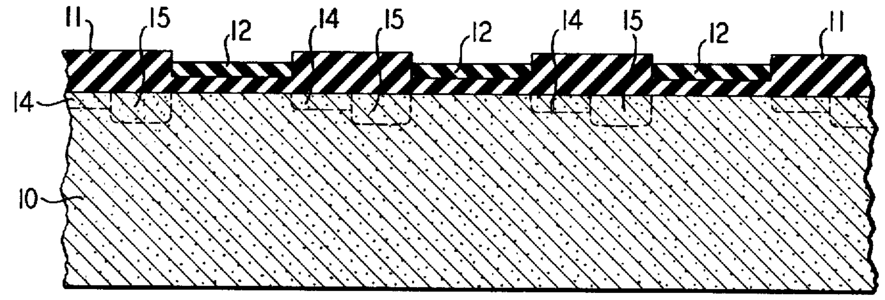

The $SiO_2$ is then regrown, for example, by thermal oxidation, to reform layer 11 as shown in FIG. 1E. Due to the presence of silicon nitride, the new oxide is formed only over the areas of the semiconductor containing the surface regions 14 and 15. The oxide is regrown advantageously to a thickness of approximately 5,000 Angstroms to produce the stepped oxide configuration shown.

Figure 1F:
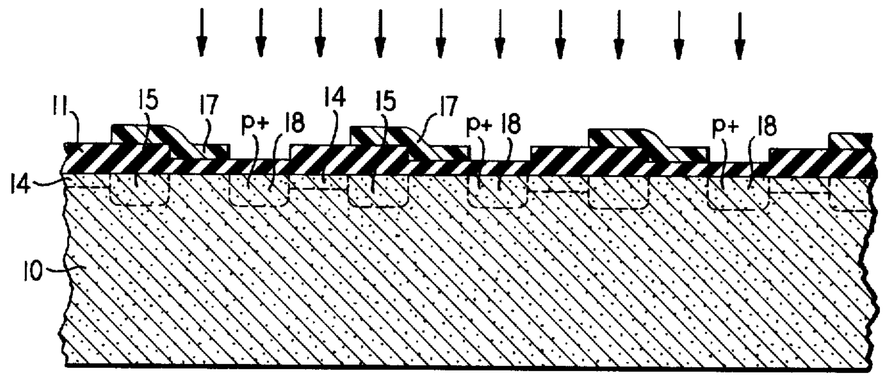

The silicon nitride layer 12 is then stripped off and a second photoresist mask, 17, as shown in FIG. 1F is formed over the oxide pattern in the same manner as the first mask described previously to form photoresist regions of width and separation W. Once again, the mask is offset with respect to the oxide steps by an amount approximately W/2 (which also means that the mask 17 is offset by an amount W with respect to mask 16 of FIG. 1D). The structure is then subject to a third ion beam, again indicated by arrows, to produce a third set of surface regions 18 in the areas of the semiconductor not covered by either an oxide step or photoresist. Once again, the regions, 18, are p-type and advantageously the third ion beam can have the same concentration as the second but in any event the regions 18 have a greater concentration then regions 14. Once again, regions 18 are shown schematically as deeper than regions 14 to indicate a greater concentration. The offsetting of the photoresist mask permits formation of surface regions 18 which are narrower than the mimimum mask features as indicated previously.

Figure 1G:
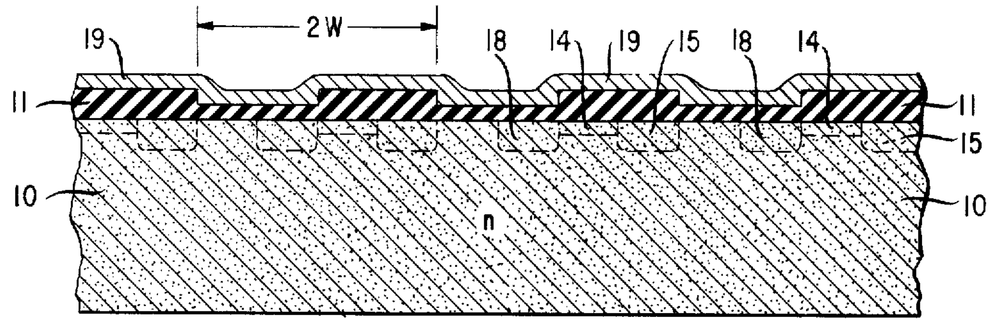

In the final steps, the photoresist mask is stripped off and a layer of a conductor, 19, is formed over the insulator as shown in FIG. 1G. This conductor is advantageously doped polysilicon, but may be any good conducting material. As shown, the cell or bit length is just 2W, with each cell characterized by a thin region of insulator covering an area of semiconductor which includes a p-type region 18 at the storage portion and a thick portion of insulator covering an area of semiconductor which includes a region of low concentration 14 at the barrier portion and high concentration 15 at the storage portion. It is known by those skilled in the art that such an arrangement will produce the proper potential asymmetry in the semiconductor to move minority carriers (in this case holes) to the right when electrode 19 is pulsed on and off. In particular, as is described in more detail in U.S. Pat. No. 3,796,932, the surface charge regions produce a stepped surface potential in the semiconductor under both the thin and thick portions of the insulator when a bias is supplied to electrode 19, with the more attractive portion of the potential produced under regions 18 and 15. When the metal is at a predetermined rest potential, the surface potential under the thick portions of insulator are more attractive to minority carriers. However, when the bias is increased to a predetermined pulsed potential, the surface potential under the thin portions of insulator is made more attractive and charge carriers residing in the semiconductor under the thick portions will transfer to beneath the thin portions. The potential under the thick portions will remain fairly constant. By successively varying the bias between the rest and pulsed potential, therefore, minority carriers are transferred to the right.

The parameters of the elements needed in achieving efficient charge transfer may vary widely and are easily determined by those skilled in the art. One specific embodiment which may be employed, presented primarily for illustrative purposes, is as follows:

| | | |
|---|---|---|
| Doping density of semiconductor (n-type silicon) | = | $10^{16}/cm^3$ |
| Thickness of insulator 11 in thin regions | = | 1,000 A |
| Thickness of insulator 11 in thick regions | = | 5,000 A |
| Thickness of silicon nitride layer 12 | = | 2,000 A |
| Thickness of $SiO_2$ layer 13 | = | 3,000 A |
| W | | 8 microns |
| Dose of first ion beam of impurities (FIG. 1C) | = | $5\times10^{11}/cm^2$ |
| Energy of first ion beam of impurities | = | 100kev |
| Thickness of photoresist layers | = | 1.5 microns |
| Dose of second ion beam of impurities (FIG. 1D) | = | $5\times10^{11}/cm^2$ |
| Energy of second ion beam of impurities | = | 100kev |
| Dose of third ion beam of impurities (FIG. 1F) | = | $5\times10^{11}/cm^2$ |
| Energy of third ion beam of impurities | = | 100kev |

Figure 2A:
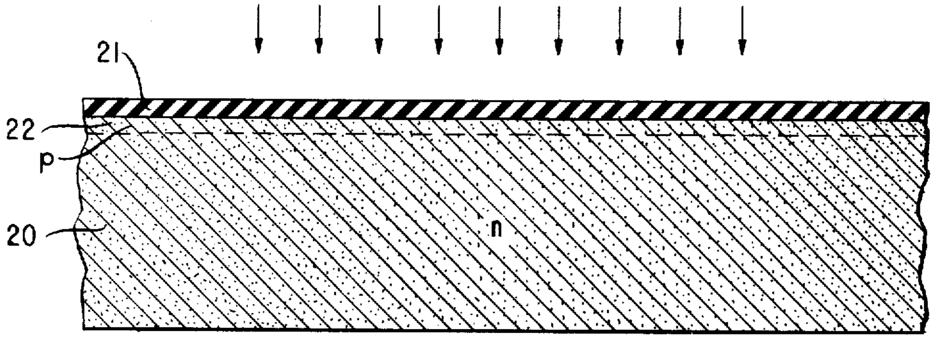
FIGS. 2A–2H are cross-sectional views of a portion of a CCD row in various stages of manufacture in accordance with a further embodiment of the invention.
Figure 2B:
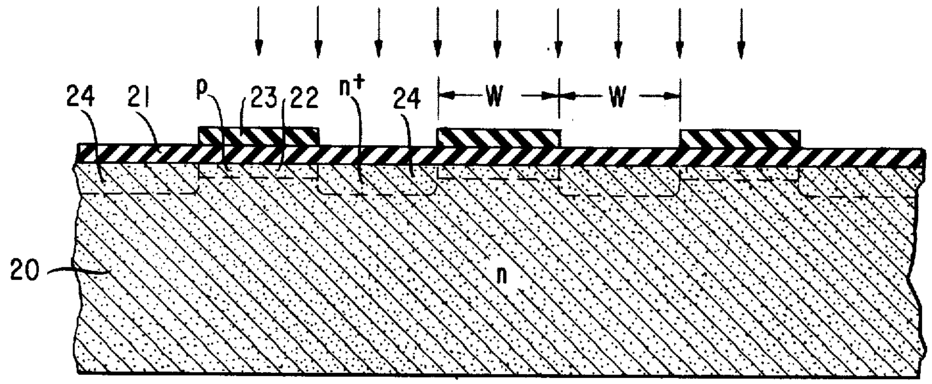

FIGS. 2A–2G illustrate a second embodiment of the invention. Again, the semiconductor medium, 20, is assumed to be n-type silicon. Formed thereon is a layer of insulator 21, such as $SiO_2$ to a thickness of approximately 1,000 Angstroms. The structure is then subject to a first ion beam of impurities, such as boron which penetrate the insulator and form a p-type surface region of impurities, 22, uniformly along the CCD row. This implant sets the interface potential under the thin oxide region of the final device to a desired level suitable for good signal handling at reasonable pulse amplitudes, but is not essential for the operation of the device. Next, utilizing a mask with apertures of width W and spacing between the apertures W, a photoresist mask 23 is formed on insulator 21 as illustrated in FIG. 2B. Then, as further shown in FIG. 2B, the structure is subject to a second ion beam of impurities indicated by the arrows to form surface regions 24 in the exposed areas of the semiconductor. In this embodiment, the surface regions comprise $n^+$-type impurities such as phosphorous which provide repulsive regions to minority carriers for potential asymmetry. Use of such regions instead of the attractive regions of the previous embodiment is an alternative known generally to those skilled in the art. The dosage of the second implant must, of course, be sufficient to compensate for the p-type uniform implant 22 to establish the $n^+$-type regions 24 in the areas indicated. Typically, a dosage of approximately $1\times10^{12}cm^{-2}$ could be used. Again, the regions 24 are shown as deeper than regions 22 for purposes of illustration and the two types of regions could extend to the same depth. An implant of suitable energy to form regions 24 to a depth of approximately 500 to 1000 Angstroms could be used.

Figure 2C:
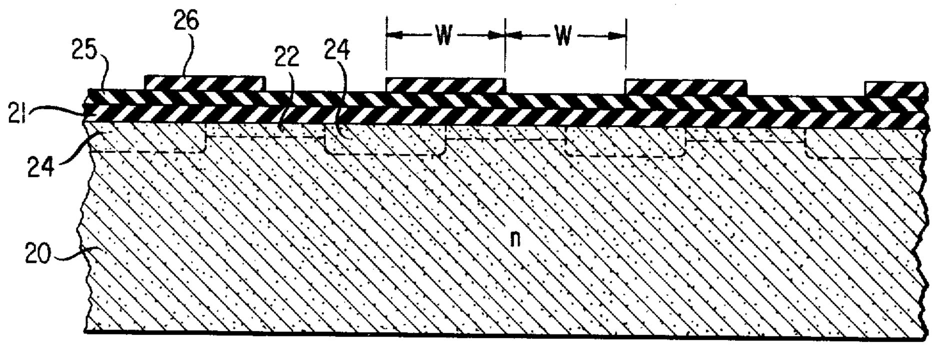
Figure 2D:
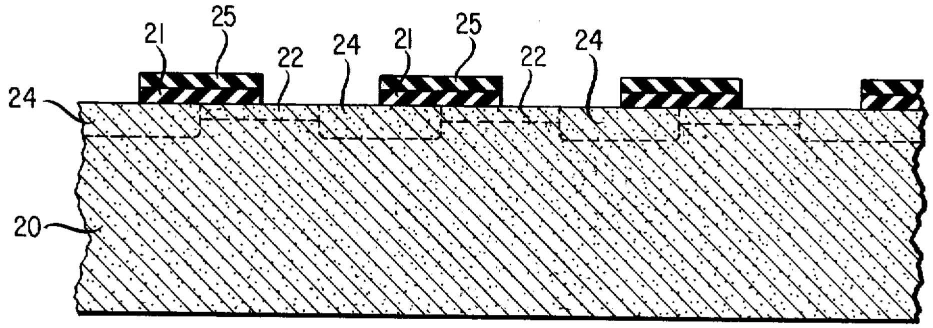

After stripping off the photoresist, a layer of silicon nitride, 25, as shown in FIG. 2C, is formed over $SiO_2$ layer 21. This is followed by forming insulating layer 26, such as $SiO_2$, uniformly over layer 25, and defining layer 26 into a mask of width and spacing W as shown. Again it will be realized that mask 26 is offset by an amount approximately equal to W/2 with respect to the photoresist mask of FIG. 2B.

Figure 2E:
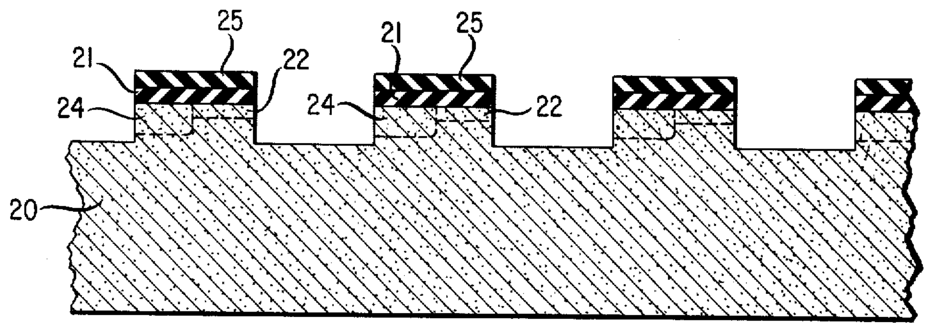

A suitable etchant is then applied for removing the portions of silicon nitride layer 25 in the areas not covered by mask 26 without affecting the $SiO_2$ layers. Next, an etchant is applied to remove mask layer 26 and the portions of layer 21 not protected by the silicon nitride layer, resulting in the structure shown in FIG. 2D. Further etching by a material such as a solution containing chromium oxide and HF removes a portion of the silicon along with the surface regions 22 and 24 in the areas not protected by the silicon nitride mask. In this example, approximately 2,000 Angstroms of silicon is etched to remove all the dopants of the two implants. The resulting structure is shown in FIG. 2E.

Figure 2F:
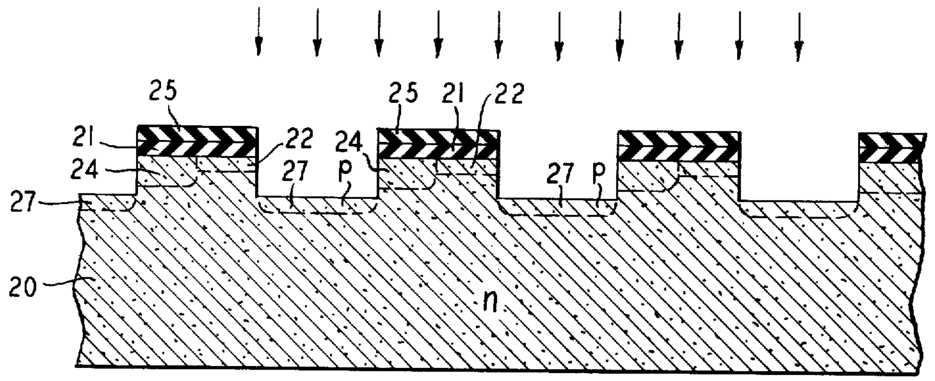

Next, as shown in FIG. 2F, the structure is subject to a third ion beam of impurities, such as boron to form p-type surface regions 27 at the etched surfaces of the semiconductor. The doping of this implant is chosen so as to set the sruface potential to a desired level for maximum signal handling for a desired clock pulse amplitude. The silicon nitride acts as a barrier to the impurities to prevent penetration into the unetched surfaces.

Figure 2G:
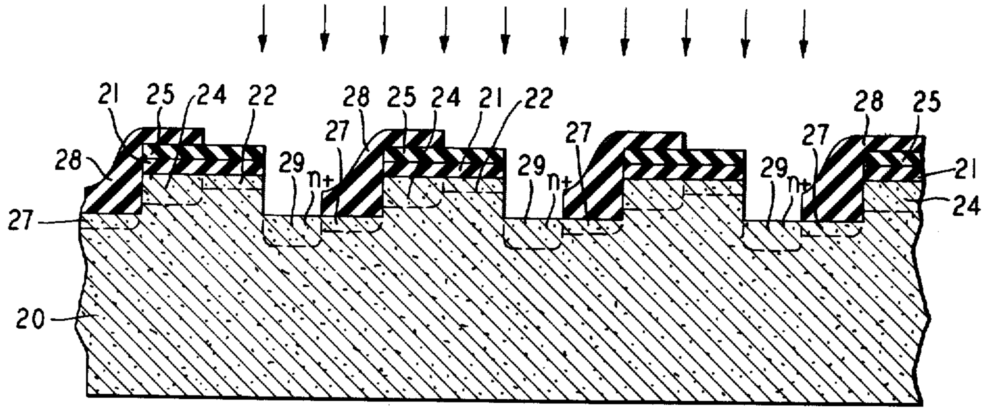

As shown in FIG. 2G, a second photoresist mask, 28, is then formed over the structure. Again, the mask portions have a width and spacing of W and are offset with respect to the etched steps by approximately W/2 (and offset by approximately W with respect to the first photoresist mask 23 of FIG. 2B). The structure is then subject to a fourth ion beam of impurities, which may be identical in dosage and beam energy to the second ion beam of FIG. 2B, in order to form $n^+$-type surface regions 29 in the areas of the semiconductor which are not covered by either the photoresist layer 28 or the silicon nitride-silicon dioxide multilayer 21 and 25.

As seen in FIG. 2G, the photoresist mask in combination with the oxide step configuration allows surface regions 29 to be made approximately W/2 in width. Regions 29 are again shown deeper than adjacent regions 27 for purposes of illustration.

Figure 2H:
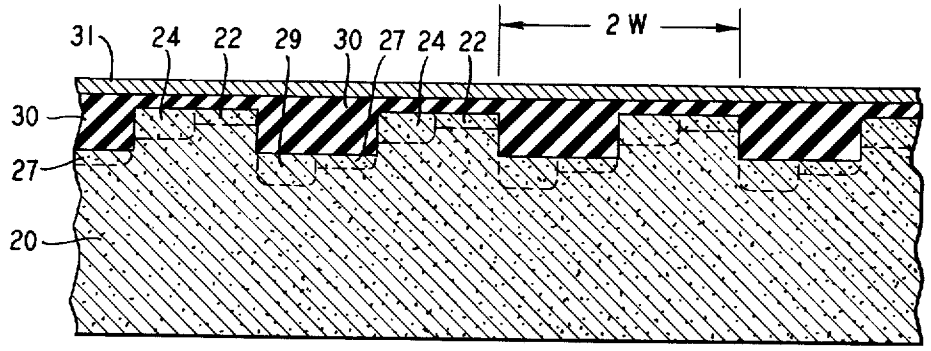

After removal of the photoresist, $SiO_2$ is reformed on the surface of the etched semiconductor (i.e., the areas not covered by silicon nitride) ideally up to the level of the $SiO_2$ layer 21, and the silicon nitride layer is then removed. The final insulating layer is shown as 30 in FIG. 2H.

A flat, single level conductor, 31, completes the uniphase structure. As in the previous embodiment, the cell length is just 2W, and the appropriate asymmetric surface potentials for uniphase operation are provided by the fixed charge regions and non-uniform insulator.

Yet another embodiment of the invention is illustrated in the sequence of steps of FIGS. 3A–3E. The storage medium, 40, is again, illustratively, a slice of silicon of *n* conductivity type. Formed on the semiconductor is an $SiO_2$ layer, 41, in the form of a step pattern with each step of width, W, and spacing between steps, W. Advantageously, the thick portions of oxide are approximately 3,000 Angstroms thick and the thin portions approximately 2,000 Angstroms in thickness. This step pattern may be formed by a variety of methods such as utilization of a silicon nitride mask over the desired thin areas and growth of further oxide in the exposed portions of the insulator by thermal oxidation. Again, the value W is the minimum mask feature.

Figure 3A:
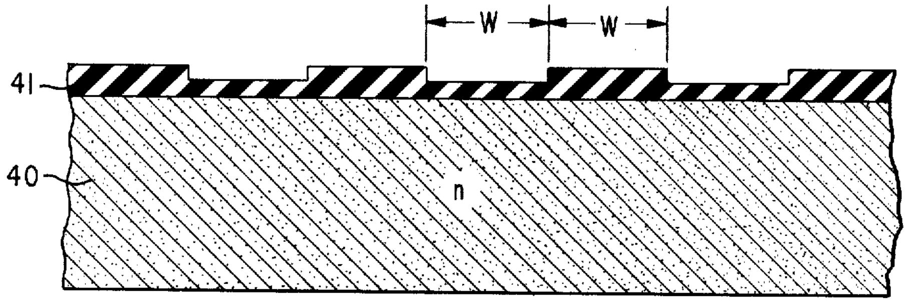
FIGS. 3A–3E are cross-sectional views of a portion of a CCD row in various stages of manufacture in accordance with a still further embodiment of the invention.
Figure 3B:
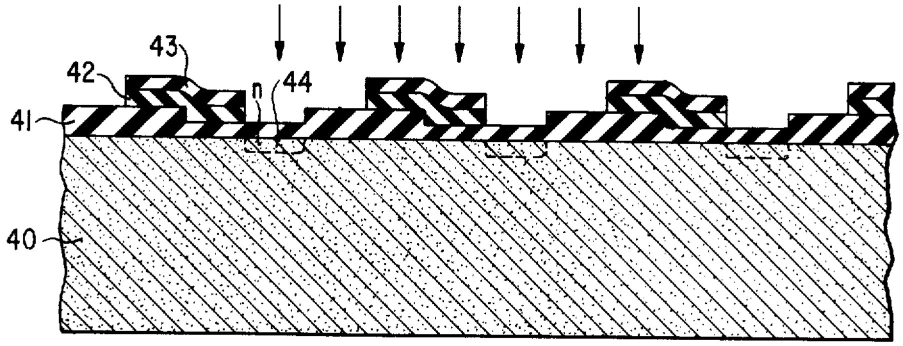

Next, the layers of silicon nitride and $SiO_2$ are successively formed uniformly over the insulator 41. Then, as in the previous embodiments, these additional insulating layers, as shown in FIG. 3B, are made into a mask pattern of regions with width W and spacing W. In FIG. 3B, the silicon nitride layer is illustrated as 42 and the $SiO_2$ layer is illustrated as 43. It will be noted that the silicon nitride-silicon dioxide regions are offset with respect to the steps of the insulator 41 by approximately W/2. The structure is then subjected to an ion beam of impurities such as phosphorous in order to form surface charge regions, 44, of $n^+$ conductivity type in the semiconductor medium. Due to the barrier effect of the multilayer regions 42 and 43 and the thick portions of the layer 41, these charge regions are confined to the area under the thin portions of layer 41 which are not covered by the mask. Consequently, the charge regions are only approximately W/2 in width.

Figure 3C:
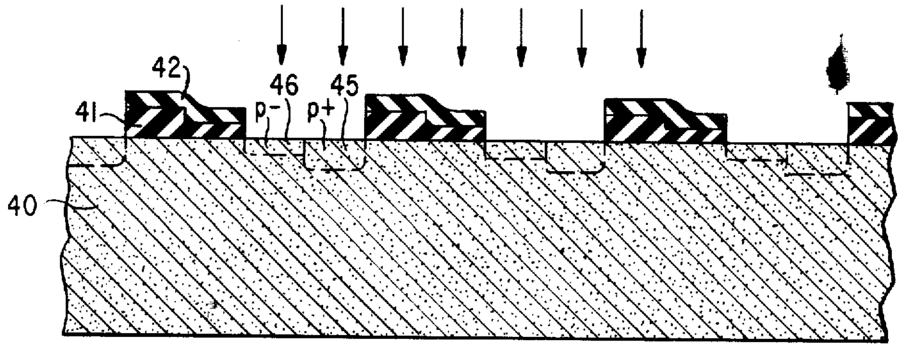

Next, as illustrated in FIG. 3C, the $SiO_2$ layer 43 and all the exposed portions of insulator 41 are etched by a material such as buffered hydrofluoric acid which leaves the silicon nitride layer 42 in place. While all the exposed insulator is removed in this example, it will be clear in this and previous embodiments that the insulator need only be thinned sufficiently to allow penetration of an ion beam to the semiconductor. The resulting structure is then subjected to a second ion beam of impurities, indicated by the arrows, which is of the opposite conductivity type as the first ion beam. This of course produced surface charge regions in the exposed portions of the semiconductor, which portions include the previously formed regions 44. Thus, as shown, the second implant results in regions 45 of $p^+$ conductivity which include only the impurities of the second beam and regions 46 of p-conductivity which include the sum of the contributions of impurities due to the first and second beams (i.e., the second $p^+$ implant compensates the $n^+$ type impurities in these regions). Again, the charge regions are shown with unequal depths to indicate the difference in impurity concentration.

Figure 3D:
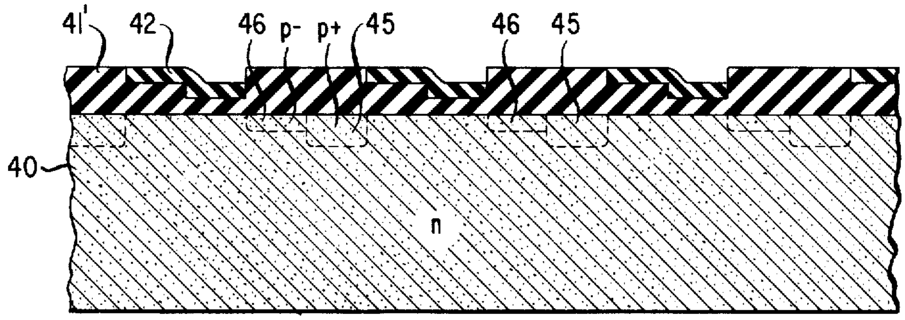
Figure 3E:
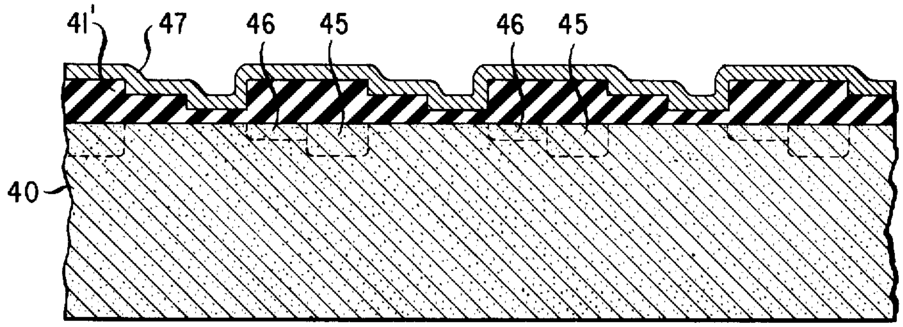

Subsequent to the second implant, as shown in FIG. 3D, the insulator is regrown on the exposed areas of the semiconductor, advantageously up to the level of the silicon nitride layer, by a thermal oxidation. The composite $SiO_2$ insulator is illustrated as 41'. The silicon nitride layer is then stripped off and in the final step, as illustrated in FIG. 3E, a uniform layer of metal 47 is deposited over insulator 41' to complete the CCD row.

It will be noted that the resulting structure produces the proper asymmetry in surface potential by both a thick-thin oxide pattern and an asymmetric surface charge distribution. That is, in the areas of semiconductor under the thickest portion of oxide, the asymmetry is provided by regions 45 and 46, while in the areas in between, the asymmetry is provided by an oxide step configuration. It will again be understood by those skilled in the art that pulsing of metal electrode 47 will move charge carriers to the right.

It will be understood from the foregoing discussion that the invention is primarily directed to forming uniphase CCDs with minimum geometries. It will be understood, however, that due to the possibility of attaining selfaligned surface charge regions, the invention may be used to advantage in forming larger cell dimensions where W need not be the minimum allowable mask feature.

Various additional modifications and extensions will become apparent to those skilled in the art. All such variations which basically rely on the teachings through which the invention has advanced the art are properly considered within the spirit and scope of the invention. In particular, combinations of insulating materials other than silicon dioxide and silicon nitride may be employed particularly if the semiconductor storage medium is other than of silicon as may be the case.

What is claimed is:

1. A method of forming a uniphase charge coupled device comprising the steps of:

forming on the semiconductor storage medium a first pattern of insulating material comprising regions of sufficiently thick insulating material to act as barriers to implantation of ions in the semiconductor, each of said regions having a width W and being separated from adjacent regions by the distance W where W is one-half the desired cell length;

forming over said insulating pattern a mask pattern in the form of discrete regions of width W such that each mask region overlies a portion of a barrier region and a portion of the space between barrier regions, exposing said structure to an ion beam so as to form implanted surface charge regions in said semiconductor only in the areas not covered by a mask region or barrier region;

forming insulating material over the area of the semiconductor including said surface regions so as to form a second insulating pattern comprising alternating relatively thick and thin regions where each region has a width W and the thick regions cover at least a portion of the semiconductor not covered by the previous barrier regions of the first insulating pattern; and forming a layer of conducting material over said insulating pattern.

2. The method according to claim 1 wherein the first insulating pattern includes over the portions of semiconductor not covered by said barrier regions an insulating layer which is thinner than said barrier regions.

3. The method according to claim 1 wherein said first insulating pattern comprises a first insulating layer of uniform thickness and a second insulating layer formed therein comprising silicon nitride in the form of discrete regions of width W separated from adjacent regions by a distance W and said second insulating pattern is fabricated by forming additional insulating material over the portions of the semiconductor not covered by said silicon nitride regions.

4. The method according to claim 1 wherein each of said mask regions overlies approximately one-half of a barrier region and one-half of the adjacent space between barrier regions.

5. The method according to claim 1 wherein the semiconductor storage medium is of a first conductivity type and said surface charge regions are of an opposite conductivity type.

6. The method according to claim 1 wherein the semiconductor storage medium is of a first conductivity type and the surface charge regions are of the same conductivity type but greater charge concentration than the semiconductor.

7. The method according to claim 1 further comprising the steps of, prior to forming said conducting layer, forming on said second insulating pattern a second mask pattern in the form of discrete regions of width W separated from adjacent regions by a distance W such that each mask region overlies a portion of a thick insulating region and an adjacent thick insulating region, and exposing said structure to a second ion beam so as to form surface charge regions in the semiconductor only in the areas not covered by a second mask region or thick insulator region of said second insulating pattern.

8. The method according to claim 1 further comprising the steps of, subsequent to the formation of said surface charge regions, removing the portions of the first insulating pattern not covered by said mask regions and exposing said structure of a second ion beam so as to form surface charge regions in the areas of semiconductors not covered by said mask regions.

9. The method according to claim 1 further comprising the step of, prior to formation of said mask pattern, etching the portions of the semiconductor surface not covered by said barrier regions.

10. A method of forming a uniphase charge coupled device comprising the steps of:

forming on a semiconductor medium of a first conducting type a first pattern of insulating material comprising a first insulating layer of uniform thickness and a second insulating layer formed thereon comprising silicon nitride in the form of discrete regions of width W and spacing between adjacent regions of a distance W, where W is one-half the desired cell length;

exposing said structure to a first ion beam of conductivity type opposite to said semiconductor so as to form a first set of surface charge regions in said semiconductor in the areas not covered by said silicon nitride regions;

forming over said insulating pattern a first mask pattern in the form of discrete regions of width W separated from adjacent regions by a distance W such that each mask region overlies a portion of a silicon nitride region and a portion of said first insulating layer;

exposing the resulting structure to a second ion beam of conductivity type opposite to said semiconductor so as to form a second set of surface charge regions in said semiconductor in the areas not covered by a mask region or silicon nitride region, each of the second set of charge regions thereby being adjacent to one of said first set of charge regions and having a charge concentration which is the sum of the contributions of said first and second ion beams;

removing said mask regions, forming additional insulating material on the portions of the first insulating layer which are not covered by the silicon nitride regions and removing said silicon nitride regions so as to form a second insulating pattern comprising alternating relatively thick and thin regions where each region has a width W and the thick regions cover the portions of the semiconductor including said first and second set of charge region;

forming over said second insulating pattern a second mask pattern in the form of discrete regions of width W separated from adjacent regions by a distance W such that each mask region overlies a portion of a thick region and a portion of a thin region of said second insulating pattern;

exposing the resulting structure to a third ion beam of conductivity type opposite to the semiconductor so as to form a third set of surface charge regions in the areas of the semiconductor not covered by a mask region or thick insulator region, each region of said third set being adjacent to a region of said first set and having a charge concentration which is greater than that of the regions of said first set;

removing said second mask pattern; and forming a layer of conducting material over said second insulating pattern.

11. A method of forming a uniphase charge-coupled device comprising the steps of:

forming on a semiconductor medium of a first conductivity type a first insulating layer of uniform thickness;

forming on said insulating layer a first mask pattern in the form of discrete regions of width W and spacing between adjacent regions of a distance W, where W is one-half the desired cell length;

exposing the resulting structure to a first ion beam of impurities of the same conductivity type as the semiconductor so as to form a first set of surface charge regions of greater concentration than said semiconductor in the areas not covered by said mask regions;

removing said mask pattern and forming on said semiconductor a first insulating pattern comprising discrete regions of silicon nitride of width W and separated from adjacent regions by a distance W, each of said regions placed so as to overlie a portion of a first surface charge region and a portion of said semiconductor not including said charge region;

etching the portions of semiconductor not covered by said silicon nitride regions to a sufficient depth in order to remove all of the surface charge regions located in these portions;

forming on the resulting structure a second mask pattern in the form of discrete regions of width W and spacing between adjacent regions of W such that each mask region overlies a portion of a silicon nitride region and a portion of an adjacent etched surface of semiconductor;

exposing the resulting structure to a second ion beam of impurities of the same conductivity type as the semiconductor so as to form a second set of surface charge regions with a higher charge concentration than said semiconductor in the areas of semiconductor not covered by either a mask region or silicon nitride region;

removing said mask regions and forming insulating material only on the etched surfaces of semiconductor so as to form a second insulating pattern of relatively thick and thin regions, said thick regions covering portions of semiconductor including one of said second set of surface charge regions and the thin regions covering portions of semiconductor including one of said first set of charge regions; and forming a layer of conducting material over said second insulating pattern.

12. The method according to claim 11 further comprising the steps of, prior to forming said first mask pattern, forming a surface charge region uniformly along the surface of the semiconductor with a conductivity type opposite to said semiconductor and, prior to forming said second mask pattern forming surface charge regions of conductivity type opposite to said semiconductor at the etched surfaces of said semiconductor.

13. A method of forming a uniphase charge coupled device comprising the steps of:

forming on a semiconductor medium of a first conductivity type a first insulating pattern comprising alternating relatively thick and thin regions of insulator, the thick portions being sufficient to act as barriers to implantation of impurities, where each region has a width W where W is one-half the desired cell length;

forming over said insulating pattern is a first mask pattern comprising discrete regions of silicon nitride of width W and spacing between the regions of W such that each mask region overlies a portion of a thick insulating region and a portion of an adjacent thin insulating region;

exposing the resulting structure to a first ion beam of impurities of the same conductivity type as the semiconductor so as to form a first set of surface charge regions in the areas of the semiconductor not covered by either a mask region or a thick insulating region;

removing the portions of the insulator not covered by said silicon nitride mask regions;

exposing the resulting structure to a second ion beam of impurities of a conductivity type opposite to the semiconductor so as to form in the areas not covered by silicon nitride regions a second set of surface charge regions of a conductivity type opposite to the semiconductor and adjacent thereto a third set of surface charge regions of opposite conductivity type which charge concentration is the sum of the contributions from said first and second beam of impurities;

forming insulating material on the portions of said semiconductor not covered by said silicon nitride regions so as to form a second insulating pattern wherein the thickest portions of the insulator overlie the portions of semiconductor including said adjacent surface charge regions;

removing said silicon nitride regions and forming over said second insulator pattern a layer of conducting material.

* * * * *